(12) United States Patent
Oikawa et al.

(10) Patent No.: US 12,089,505 B2
(45) Date of Patent: Sep. 10, 2024

(54) MAGNETIC MEMORY DEVICE

(71) Applicant: Kioxia Corporation, Tokyo (JP)

(72) Inventors: Tadaaki Oikawa, Seoul (KR); Youngmin Eeh, Seongnam-si (KR); Eiji Kitagawa, Seoul (KR); Taiga Isoda, Seoul (KR)

(73) Assignee: Kioxia Corporation, Tokyo (JP)

( * ) Notice: Subject to any disclaimer, the term of this patent is extended or adjusted under 35 U.S.C. 154(b) by 459 days.

(21) Appl. No.: 17/546,455

(22) Filed: Dec. 9, 2021

(65) Prior Publication Data

US 2023/0062011 A1 Mar. 2, 2023

(30) Foreign Application Priority Data

Aug. 26, 2021 (JP) ................. 2021-138090

(51) Int. Cl.
*H10N 50/80* (2023.01)
*H10B 61/00* (2023.01)
*H10N 50/85* (2023.01)

(52) U.S. Cl.
CPC ............. *H10N 50/80* (2023.02); *H10B 61/00* (2023.02); *H10N 50/85* (2023.02)

(58) Field of Classification Search
CPC ......... H10N 50/80; H10N 61/00; H10N 50/85
USPC ....................................................... 257/421
See application file for complete search history.

(56) References Cited

U.S. PATENT DOCUMENTS

| | | | |
|---|---|---|---|
| 8,995,181 B2 | 3/2015 | Watanabe et al. |
| 9,130,143 B2 | 9/2015 | Nagase et al. |
| 9,142,756 B2 | 9/2015 | Nagamine et al. |
| 9,178,137 B2 | 11/2015 | Eeh et al. |
| 9,184,374 B2 | 11/2015 | Sawada et al. |
| 9,209,386 B2 | 12/2015 | Nagamine et al. |
| 9,252,357 B2 | 2/2016 | Watanabe et al. |
| 9,269,890 B2 | 2/2016 | Nakayama et al. |

(Continued)

FOREIGN PATENT DOCUMENTS

| | | |
|---|---|---|
| JP | 6180972 B2 | 8/2017 |
| JP | 2019054095 A | 4/2019 |

(Continued)

OTHER PUBLICATIONS

U.S. Appl. No. 17/199,593; First Named Inventor: Eiji Kitagawa; Title: Magnetic Memory Device and Method for Manufacturing the Same; filed Mar. 12, 2021.

(Continued)

*Primary Examiner* — Jami Valentine Miller
(74) *Attorney, Agent, or Firm* — Holtz, Holtz & Volek PC

(57) ABSTRACT

According to one embodiment, a magnetic memory device includes a first magnetic layer having a variable magnetisation direction, a second magnetic layer having a fixed magnetization direction, a nonmagnetic layer provided between the first magnetic layer and the second magnetic layer, a third magnetic layer provided on a lower side of the first magnetic layer, the second magnetic layer and the nonmagnetic layer, having a fixed magnetization direction antiparallel to the magnetization direction of the second magnetic layer, and formed of an alloy of cobalt (Co) and platinum (Pt), and a buffer layer provided on a lower side of the third magnetic layer and including a first layer portion containing rhenium (Re).

15 Claims, 4 Drawing Sheets

(56) References Cited

U.S. PATENT DOCUMENTS

| | | |
|---|---|---|
| 9,293,695 B2 | 3/2016 | Ueda et al. |
| 9,461,240 B2 | 10/2016 | Sawada et al. |
| 9,466,350 B2 | 10/2016 | Murayama et al. |
| 9,608,199 B1 | 3/2017 | Kitagawa |
| 9,620,561 B2 | 4/2017 | Nagase et al. |
| 9,640,584 B2 | 5/2017 | Nagamine et al. |
| 9,647,203 B2 | 5/2017 | Kitagawa et al. |
| 9,705,076 B2 | 7/2017 | Nagamine et al. |
| 9,741,928 B2 | 8/2017 | Ueda et al. |
| 9,859,491 B2 | 1/2018 | Daibou et al. |
| 9,947,862 B2 | 4/2018 | Watanabe et al. |
| 9,991,313 B2 | 6/2018 | Watanabe et al. |
| 10,026,888 B2 | 7/2018 | Ochiai et al. |
| 10,026,891 B2 | 7/2018 | Nagase et al. |
| 10,090,459 B2 | 10/2018 | Watanabe et al. |
| 10,103,318 B2 | 10/2018 | Watanabe et al. |
| 10,199,568 B2 | 2/2019 | Nagamine et al. |
| 10,211,256 B2 | 2/2019 | Kitagawa |
| 10,263,178 B2 | 4/2019 | Sawada et al. |
| 10,388,343 B2 | 8/2019 | Oikawa et al. |
| 10,468,170 B2 | 11/2019 | Eeh et al. |
| 10,510,950 B2 | 12/2019 | Watanabe et al. |
| 10,840,434 B2 | 11/2020 | Kitagawa et al. |
| 10,873,021 B2 | 12/2020 | Eeh et al. |
| 11,127,445 B2 | 9/2021 | Eeh et al. |
| 11,201,189 B2 | 12/2021 | Eeh et al. |
| 2014/0284534 A1 | 9/2014 | Nagase et al. |
| 2014/0284733 A1 | 9/2014 | Watanabe et al. |
| 2015/0068887 A1 | 3/2015 | Nagamine et al. |
| 2015/0069544 A1 | 3/2015 | Nagamine et al. |
| 2015/0069554 A1 | 3/2015 | Nakayama et al. |
| 2015/0194598 A1* | 7/2015 | Huai ............. H01F 41/302 257/421 |
| 2015/0259788 A1 | 9/2015 | Nagamine et al. |
| 2016/0099408 A1 | 4/2016 | Nagamine et al. |
| 2016/0130693 A1 | 5/2016 | Sawada et al. |
| 2016/0260773 A1 | 9/2016 | Kitagawa et al. |
| 2016/0268501 A1 | 9/2016 | Kitagawa |
| 2017/0263678 A1 | 9/2017 | Kitagawa |
| 2017/0263679 A1 | 9/2017 | Ozeki et al. |
| 2017/0263680 A1 | 9/2017 | Yoshino et al. |
| 2018/0076262 A1 | 3/2018 | Eeh et al. |
| 2018/0205006 A1 | 7/2018 | Watanabe et al. |
| 2018/0269043 A1 | 9/2018 | Ueda et al. |
| 2018/0277745 A1 | 9/2018 | Oikawa et al. |
| 2018/0309048 A1 | 10/2018 | Ochiai et al. |
| 2020/0035910 A1* | 1/2020 | Li ............. G11C 11/18 |
| 2020/0075671 A1 | 3/2020 | Ozeki et al. |
| 2020/0294567 A1 | 9/2020 | Oikawa et al. |
| 2020/0302987 A1 | 9/2020 | Sawada et al. |
| 2020/0303632 A1 | 9/2020 | Watanabe et al. |
| 2020/0350489 A1* | 11/2020 | Park ............. H10N 50/80 |
| 2021/0074908 A1 | 3/2021 | Oikawa et al. |
| 2021/0074911 A1 | 3/2021 | Isoda et al. |
| 2021/0083170 A1 | 3/2021 | Sawada et al. |
| 2021/0287728 A1 | 9/2021 | Isoda et al. |
| 2021/0287755 A1 | 9/2021 | Aikawa et al. |
| 2021/0288240 A1 | 9/2021 | Sawada et al. |
| 2022/0302205 A1* | 9/2022 | Oikawa ............. H10N 50/85 |
| 2022/0302371 A1* | 9/2022 | Koui ............. H10B 61/10 |
| 2023/0062011 A1* | 3/2023 | Oikawa ............. H10B 61/00 |

FOREIGN PATENT DOCUMENTS

| | | |
|---|---|---|
| JP | 2020155442 A | 9/2020 |
| JP | 2021044429 A | 3/2021 |

OTHER PUBLICATIONS

U.S. Appl. No. 17/389,399; First Named Inventor: Eiji Kitagawa; Title: Magnetoresistance Memory Device; filed Jul. 30, 2021.

U.S. Appl. No. 17/471,340; First Named Inventor: Eiji Kitagawa; Title: Magnetic Memory Device; filed Sep. 10, 2021.

U.S. Appl. No. 17/472,056; First Named Inventor: Eiji Kitagawa; Title: Magnetic Memory Device; filed Sep. 10, 2021.

U.S. Appl. No. 17/472,131; First Named Inventor: Eiji Kitagawa; Title: Magnetic Memory Device; filed Sep. 10, 2021.

U.S. Appl. No. 17/472,472; First Named Inventor: Eiji Kitagawa; Title: Magnetic Memory Device; filed Sep. 10, 2021.

U.S. Appl. No. 17/549,248; First Named Inventor: Eiji Kitagawa; Title: Magnetoresistance Memory Device; filed Dec. 13, 2021.

U.S. Appl. No. 17/550,194; First Named Inventor: Eiji Kitagawa; Title: Memory Device; filed Dec. 14, 2021.

Hirosawa, "Current Status of Research and Development toward Permanent Magnets Free from Critical Elements", Journal of the Magnetics Society of Japan (vol. 39, No. 3), 2015, pp. 85-95, DOI: 10.3379/msjmag. 1504R004.

Mitsuzuka, et al., "Pt Content Dependence of Magnetic Properties of CoPt/Ru Patterned Films", IEEE Transactions on Magnetics (vol. 42, No. 12), 2006, pp. 3883-3885, DOI: 10.1109/TMAG.2006. 878667.

Sato, et al., "Magnetic Anisotropy of Co—M—Pt (M = Cr, Mo, Ru, W, Re) Perpendicular Films Deposited on Various Seed Layer Materials", IEEE Transactions on Magnetics (vol. 43, No. 6), 2007, pp. 2106-2108, DOI: 10.1109/TMAG.2007.892540.

Shimatsu, et al., "Effect of thermal agitation on the switching field distributions of CoPtCr—SiO2 perpendicular recording media", Journal of Applied Physics (vol. 99, No. 8), 2006, p. 08F905 (4 pages), DOI: 10.1063/1.2172577.

Shimatsu, et al., "Large uniaxial magnetic anisotropy by lattice deformation in CoPt/Ru perpendicular films", Journal of Applied Physics (vol. 99, No. 8), 2006, p. 08G908 (4 pages), DOI: 10.1063/ 1.2167351.

Weller, et al., "High Ku Materials Approach to 100 Gbits/in2", IEEE Transactions on Magnetics (vol. 36, No. 1), 2000, pp. 10-15, DOI: 10.1109/20.824418.

* cited by examiner

MAGNETIC MEMORY DEVICE

CROSS-REFERENCE TO RELATED APPLICATIONS

This application is based upon and claims the benefit of priority from Japanese Patent Application No. 2021-133090, filed Aug. 26, 2021, the entire contents of which are incorporated herein by reference.

FIELD

Embodiments described herein relate generally to a magnetic memory device.

BACKGROUND

Magnetic memory devices in which a magnetoresistance effect element is integrated on a semiconductor substrate have been proposed.

DETAILED DESCRIPTION

In general, according to one embodiment, a magnetic memory device includes: a first magnetic layer having a variable magnetization direction; a second magnetic layer having a fixed magnetization direction; a nonmagnetic layer provided between the first magnetic layer and the second magnetic layer; a third magnetic layer provided on a lower side of the first, magnetic layer, the second magnetic layer and the nonmagnetic layer, having a fixed magnetization direction antiparallel to the magnetization direction of the second magnetic layer, and formed of an alloy of cobalt (Co) and platinum (Pt); and a buffer layer provided on a lower side of the third magnetic layer and including a first layer portion containing rhenium (Re).

The embodiments will now be described below with reference to the accompanying drawings.

Figure 1:
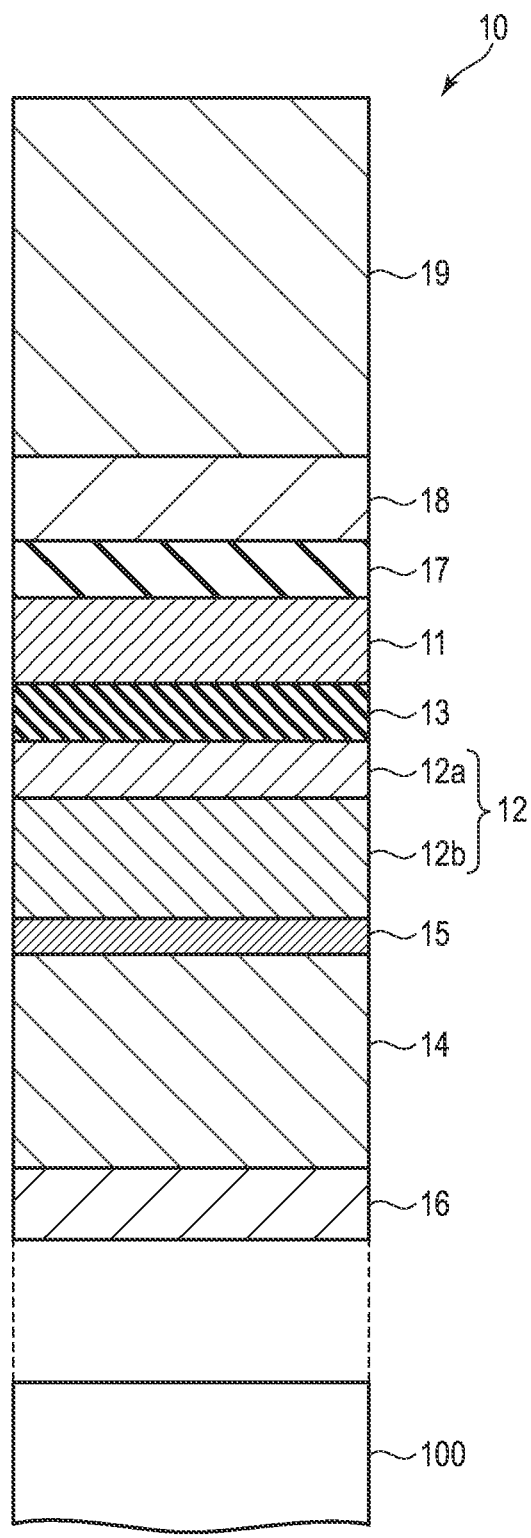
FIG. 1 is a cross-sectional view schematically showing a configuration of a stacked structure of a magnetoresistance effect element contained in a magnetic memory device according to an embodiment.

FIG. 1 is a cross-sectional view schematically showing the configuration of a stacked structure of a magnetoresistance effect element contained in a magnetic memory device according to an embodiment. As the magnetoresistance effect element, a magnetic tunnel junction (MTJ) element is employed.

A stacked structure 10 is provided above a semiconductor substrate 100 and includes a storage layer (first magnetic layer) 11, a reference layer (second magnetic layer) 12, a tunnel barrier layer (nonmagnetic layer) 13, a shift-canceling layer (third magnetic layer) 15, a spacer layer 15, a buffer layer 16, a lower cap layer 17, a top layer 16 and an upper cap layer 19.

The storage layer (first magnetic layer) 11 is a ferromagnetic layer with a variable magnetization direction. The variable magnetization direction means that the magnetization direction changes for a predetermined write current. The storage layer 11 is formed of an FeCoB layer containing iron (Fe), cobalt (Co) and boron (B).

The reference layer (second magnetic layer) 12 is a ferromagnetic layer with a fixed magnetization direction. The fixed magnetization direction means that the magnetization direction does not change for a predetermined write current. The reference layer 12 includes a first, layer portion 12a and a second layer portion 12b. The first layer portion 12a is formed of an FeCoB layer containing iron (Fe), cobalt (Co) and boron (B). The second layer portion 12b contains cobalt (Co) and at least one element selected from platinum (Pt), nickel (Ni) and palladium (Pd).

The tunnel barrier layer (nonmagnetic layer) 13 is an insulating layer provided between the storage layer 11 and the reference layer 12. The tunnel barrier layer 13 is formed of an MgO layer containing magnesium (Mg) and oxygen (O).

The shift-canceling layer (third magnetic layer) 14 is provided on the lower side of the storage layer 11, the reference layer 12 and the tunnel barrier layer 13. The shift-canceling layer 14 is a ferromagnetic layer with a fixed magnetization direction that is antiparallel to the magnetization direction of the reference layer 12, and has the function of canceling a magnetic field applied from the reference layer 12 to the storage layer 11.

The shift-canceling layer 14 contains cobalt (Co) and platinum (Pt). More specifically, the shift-canceling layer 14 is formed of an alloy of cobalt (Co) and platinum (Pt). The Pt composition ratio in the CoPt alloy constituting the shift canceling layer 14 should preferably be in a range from 20% to 30%. In other words, the concentration of Pt in the CoPt alloy should be in a range of 20 atomic % to 35 atomic %. The shift-canceling layer 14 has a hexagonal close-packed (hcp) crystal structure and has a (001) plane of the hop crystal structure in a direction perpendicular to its main surface. That is, the shift-canceling layer 34 has the (001) plane of the hop crystal structure in the direction perpendicular to an interface between the shift-canceling layer 14 and the spacer layer 15 and an interface between the shift-canceling layer 14 and the buffer layer 16.

The spacer layer 15 is provided between the reference layer 12 and the shift-canceling layer 14, and the reference layer 12 and the shift-canceling layer 14 are anti-ferromagnetically coupled by the spacer layer 15. In other words, the reference layer 12, the shift-canceling layer 14 and the spacer layer 15 form a synthetic anti-ferromagnetic (SAF) structure. The spacer layer 15 is formed from a ruthenium (Ru) layer or an iridium (Ir) layer.

The buffer layer 16 is provided on the lower side of the shift-canceling layer 14 and is in contact with the shift-canceling layer 14. As will be described later, the buffer layer 16 includes a first layer portion containing at least one of rhenium (Re) and osmium (Os).

The lower cap layer 17 is provided on the upper side of the storage layer 11 and is formed of a predetermined oxide material. Here specifically, the lower cap layer 17 is formed of MgO or a rare-earth oxide such as GdO, or the like. The top layer 18 is provided on the upper side of the lower cap layer 17 and is formed of a predetermined conductive material. The upper cap layer 19 is provided on the upper side of the top layer 18 and is formed of a predetermined conductive material. More specifically, the top layer 18 and the upper cap layer 19 are each formed of a metal material such as ruthenium (Ru), tungsten (W), molybdenum (Mo) or tantalum (Ta).

The magnetoresistance effect element constituted by the above-described stacked structure 10 is a spin transfer torque (STT) magnetoresistance effect element having perpendicular magnetization. That is, the magnetization directions of the storage layer 11, the reference layer 12 and the shift-canceling layer 14 are perpendicular to the respective film surfaces.

When the magnetization direction of the storage layer 11 is parallel to the magnetization direction of the reference layer 12, the magnetoresistance effect element is in a relatively low-resistance state, whereas when the magnetization direction of the storage layer 11 is anti-parallel to the magnetization direction of the reference layer 12, the magnetoresistance effect element is in a relatively high-resistance state. With this configuration, the magnetoresistance effect element can store binary data according to the resistance state of the magnetoresistance effect element. Further, according to the direction of the current flowing in the magnetoresistance effect element, a low resistance state or a high resistance state can be set to the magnetoresistance effect element.

Figure 2:
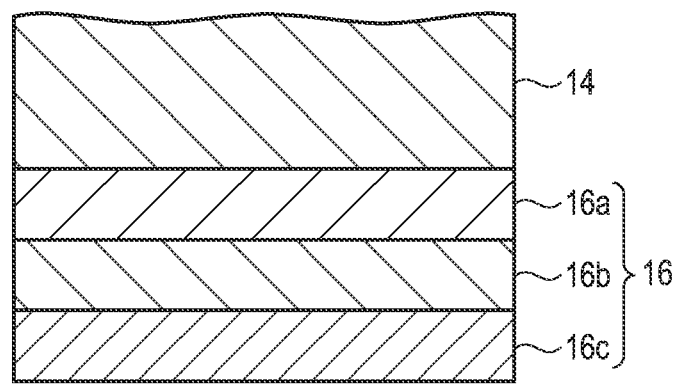
FIG. 2 is a cross-sectional view schematically showing a first configuration example of a buffer layer of the magnetic memory device of the embodiment.

FIG. 2 is a cross-sectional view schematically showing the first configuration example of the buffer layer 16.

As shewn in FIG. 2, the buffer layer 16 includes a first layer portion 16a, a second layer portion 16b and a third layer portion 16c.

The first layer portion 16a is provided on the lower side of the shift-canceling layer 14 and is in contact with the shift-canceling layer 14. The first layer portion 16a contains at least one of rhenium (Re) and osmium (Os). That is, the first layer portion 16a may be formed from an Re layer, an Os layer or an ReOs layer. The first layer portion 16a has an hop crystal structure and has a (001) plane of the hop crystal structure in the direction perpendicular to its main surface. In other words, the first layer portion 16a has the (001) plane of the hop crystal structure in the direction perpendicular to an interface between the first layer portion 16a and the shift-canceling layer 14.

The second layer portion 16b is provided on the lower side of the first layer portion 16a, is in contact with the first layer portion 16a, and contains platinum (Pt). In other words, the second layer portion 16b is formed from a Pt layer. The second layer portion 16b has a face-centered cubic (fcc) crystal structure and has a (111) plane of the fcc crystal structure in the direction perpendicular to its main surface. In other words, the second layer portion 16b has the (111) plane of the fcc crystal structure in the direction perpendicular to an interface between the second layer portion 16b and the first layer portion 16a, and in the direction perpendicular to an interface between the second layer portion 16b and the third layer portion 16c.

The third layer portion 16c is provided on the lower side of the second layer portion 16b, is in contact with the second layer portion 16b, and contains tantalum (Ta). That is, the third layer portion 16b is formed from a Ta layer.

Figure 3:
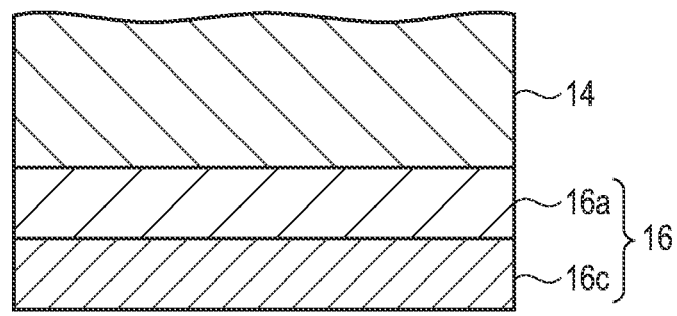
FIG. 3 is a cross-sectional view schematically showing a second configuration example of the buffer layer of the magnetic memory device of the embodiment.

FIG. 3 is a cross-sectional view schematically showing the second configuration example of the buffer layer 16.

In the second configuration example, the second layer portion 16b is not provided and the third layer portion 16c is in contact with the first layer portion 16a. The other basic configuration is similar to that of the first configuration example shown in FIG. 2.

As described above, in this embodiment, the buffer layer 36 includes a first, layer portion 36a containing at least one of rhenium (Re) and osmium (Os), and the first layer portion 16a has a (001) plane of the hop crystal structure in the direction perpendicular to its main surface. Thus, an excellent shift-canceling layer 14 having a (001) plane of the hop crystal structure in the direction perpendicular to its main surface can be formed by sputtering.

Here, it is conventionally difficult to form a shift-canceling layer having high perpendicular magnetic anisotropy on the buffer layer by sputtering; however, according to this embodiment, it is possible to form a shift-canceling layer 14 having high perpendicular magnetic anisotropy on the first layer portion 16a of the buffer layer 16. Therefore, in this embodiment, it is possible to reduce the write current Ic and thus a magnetoresistance effect element having excellent characteristics can be obtained. In particular, by setting the Pt composition ratio of the CoPt alloy layer constituting the shift-canceling layer 14 in a range from 20% to 35%, the perpendicular magnetic anisotropy of the shift-canceling layer can be further enhanced as will be described below.

Figure 4:
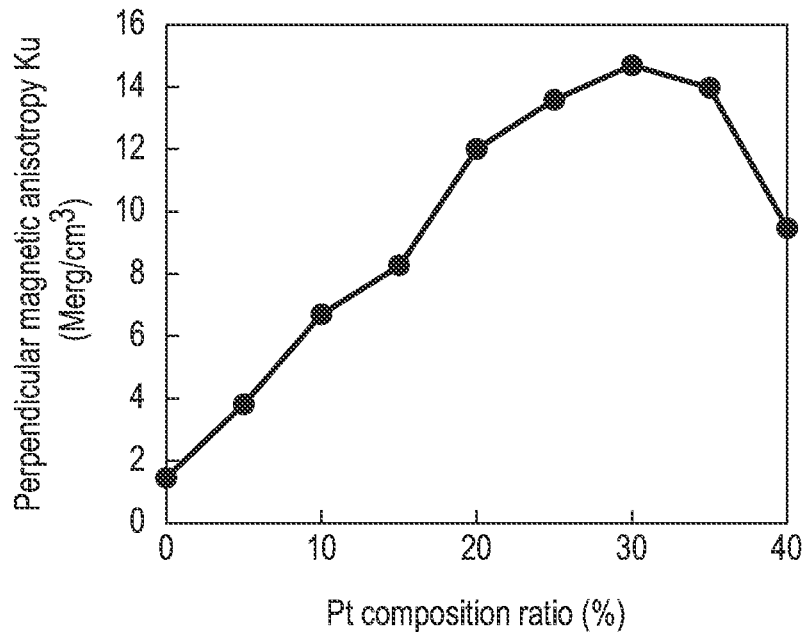
FIG. 4 is a diagram showing the relationship between a Pt composition ratio of a CoPt alloy and a perpendicular magnetic anisotropy Ku.

FIG. 4 is a diagram showing the relationship between the Pt composition ratio of the CoPt alloy and the perpendicular magnetic anisotropy Ku.

As shown in FIG. 4, the perpendicular magnetic anisotropy Ku increases sharply when the Pt composition ratio is about 20% or higher. On the other hand, it is known that when the Pt composition ratio exceeds 35%, the fcc crystal structure appears and it becomes difficult to obtain an excellent hop crystal structure. Therefore, in order to obtain a CoPt alloy layer having a good hop crystal structure and high perpendicular magnetic anisotropy, the Pt composition ratio of the CoPt alloy layer constituting the shift-canceling layer 14 should preferably be in the range from 20% to 35%.

Figure 5:
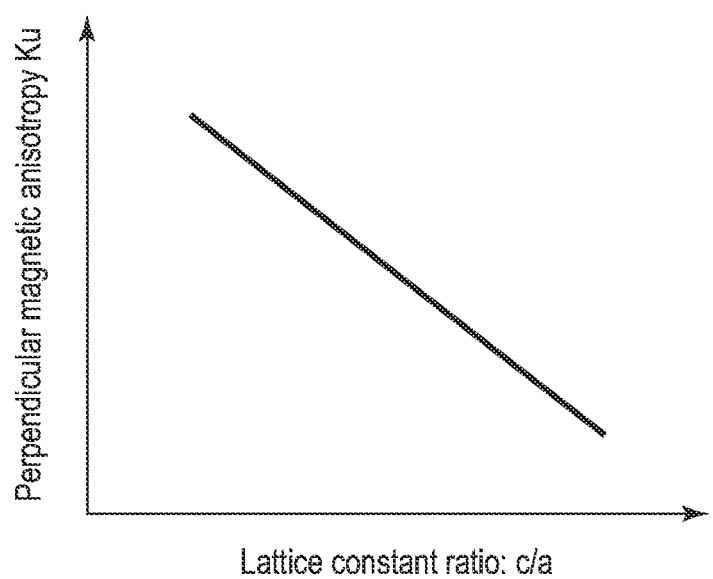
FIG. 5 is a diagram showing the relationship between a ratio or a lattice constant in a c-axis direction to a lattice constant in an a-axis direction, c/a, of the CoPt alloy having an hcp crystal structure and the perpendicular magnetic anisotropy Ku.

FIG. 5 is a diagram showing the relationship between the ratio c/a of the lattice constant in the c-axis direction to the lattice constant in the a-axis direction of the CoPt alloy layer having an hop crystal structure and the perpendicular magnetic anisotropy Ku.

As shown in FIG. 5, the perpendicular magnetic anisotropy Ku increases as the lattice constant ratio c/a decreases. The lattice constant ratio c/a of the CoPt alloy layer is strongly affected by the lattice constant of the material layer in contact with the CoPt alloy layer. In this embodiment, the shift-canceling layer 14 is formed on the first layer portion 16a of the buffer layer 16, and therefore the lattice constant ratio c/a of the CoPt alloy layer used for the shift-canceling layer 14 is strongly affected by the first layer portion 16a of the buffer layer 16. Here, by forming the first layer portion 16a of the buffer layer 16 from a material containing at least one of rhenium (Re) and osmium (Os), the lattice constant ratio c/a of the CoPt alloy can be adjusted to an optimum value, and the perpendicular magnetic anisotropy Ku of the shift-canceling layer 14 can be improved.

Figure 6:
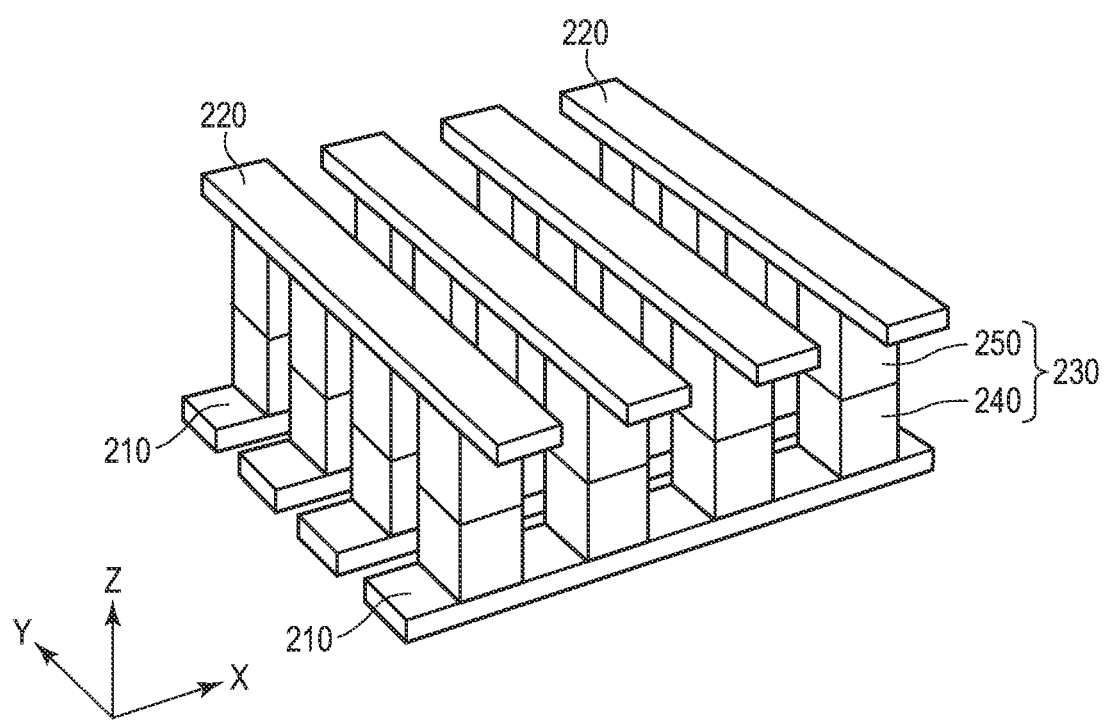
FIG. 6 is a perspective view schematically showing the configuration of a magnetic memory device to which the magnetoresistance effect element of the embodiment is applied.

FIG. 6 is a perspective view schematically showing a structure of a magnetic memory device to which the magnetoresistance effect element discussed in the embodiment provided above is applied.

The magnetic memory device shown in FIG. 6 includes a plurality of first wires 210 extending in the X direction, a plurality of second wires 220 extending in the Y direction intersecting the X direction, and a plurality or memory cells 230 connected between the first wires 210 and the second wires 220, respectively. For example, the first wires 210 corresponds to word lines and the second wires 220 correspond to bit lines, or vice versa.

Each memory cell 230 contains a magnetoresistance effect element 240 and a selector (switching element) 250 connected in series to the magnetoresistance effect element 240.

By applying a predetermined voltage between a first wire 210 and a second wire 220 connected to a desired memory cell 230, the selector 250 contained in the desired memory cell 230 can be set in an on state, thus enabling to read from or write to the magnetoresistance effect element 240 contained in the desired memory cell 230.

Note that the magnetic memory device shown in FIG. 6 has a configuration in which the selector 250 is provided on the upper side of the magnetoresistance effect element 240, but such a configuration as well will do that the selector 250 is provided on the lower side of the magnetoresistance effect element 240.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without depart from the spirit of the inventions. The accompanying claims and their equivalents are intended to cover such forms or modifications as would fall within the scope and spirit of the invention.

What is claimed is:

1. A magnetic memory device comprising:
   a first magnetic layer having a variable magnetization direction;
   a second magnetic layer having a fixed magnetization direction;
   a nonmagnetic layer provided between the first magnetic layer and the second magnetic layer;
   a third magnetic layer provided on a lower side of the first magnetic layer, the second magnetic layer and the nonmagnetic layer, having a fixed magnetization direction antiparallel to the magnetization direction of the second magnetic layer, and formed of an alloy of cobalt (Co) and platinum (Pt); and
   a buffer layer provided on a lower side of the third magnetic layer and including a first layer portion containing rhenium (Re).

2. The device of claim 1, wherein
   a composition ratio of platinum (Pt) in the third magnetic layer is in a range from 20% to 35%.

3. The device of claim 1, wherein
   the first layer portion has a (001) plane of an hcp crystal structure in a direction perpendicular to a main surface thereof.

4. The device of claim 1, wherein
   the third magnetic layer has a (001) plane or an hop crystal structure in a direction perpendicular to a main surface thereof.

5. The device of claim 1, wherein
   the buffer layer further includes a second layer portion containing platinum (Pt), on a lower side of the first layer portion.

6. The device of claim 5, wherein
   the second layer portion has a (111) plane of an fcc crystal structure in a direction perpendicular to a main surface thereof.

7. The device of claim 5, wherein
   the buffer layer further includes a third layer portion containing tantalum (Ta), on a lower side of the second layer portion.

8. The device of claim 1, wherein
   the buffer layer further includes a third layer portion containing tantalum (Ta), on a lower side of the first layer portion.

9. A magnetic memory device comprising:
   a first magnetic layer having a variable magnetization direction;
   a second magnetic layer having a fixed magnetization direction;
   a nonmagnetic layer provided between the first magnetic layer and the second magnetic layer;
   a third magnetic layer provided on a lower side of the first magnetic layer, the second magnetic layer and the nonmagnetic layer, having a fixed magnetization direction antiparallel to the magnetization direction of the second magnetic layer, formed of an alloy of cobalt (Co) and platinum (Pt), and having a composition ratio of platinum (Pt) in a range from 20% to 35%; and
   a buffer layer provided on a lower side of the third magnetic layer and including a first layer portion containing at least one of rhenium (Re) and osmium (Os).

10. The device of claim 9, wherein
    the first layer portion has a (001) plane of an hcp crystal structure in a direction perpendicular to a main surface thereof.

11. The device of claim 9, wherein
    the third magnetic layer has a (001) plane of an hop crystal structure in a direction perpendicular to a main surface thereof.

12. The device of claim 9, wherein
    the buffer layer further includes a second layer portion containing platinum (Pt), on a lower side of the first layer portion.

13. The device of claim 12, wherein
    the second layer portion has a (111) plane of an fcc crystal structure in a direction perpendicular to a main surface thereof.

14. The device of claim 12, wherein
    the buffer layer further includes a third layer portion containing tantalum (Ta), on a lower side of the second layer portion.

15. The device of claim 9, wherein
    the buffer layer further includes a third layer portion containing tantalum (Ta), on a lower side of the first layer portion.

* * * * *